United States Patent [19]
Smayling et al.

[11] Patent Number: 6,118,706
[45] Date of Patent: Sep. 12, 2000

[54] FLASH MEMORY BLOCK OR SECTOR CLEAR OPERATION

[75] Inventors: Michael C. Smayling, Sunnyvale, Calif.; Giulio G. Marotta, Contigliano; Giovanni Santin, Santa Rufina, both of Italy

[73] Assignee: Texas Instruments Incorporated, Dallas, Tex.

[21] Appl. No.: 09/373,436

[22] Filed: Aug. 11, 1999

[30] Foreign Application Priority Data

Aug. 13, 1998 [IT] Italy ................................ RM98A0543

[51] Int. Cl.[7] ...................................................... G11C 16/04
[52] U.S. Cl. .................................. 365/185.33; 365/185.11
[58] Field of Search ......................... 365/185.33, 185.29, 365/185.05, 185.11, 185.16, 185.26

[56] References Cited

U.S. PATENT DOCUMENTS

5,875,130  2/1999  Haddad et al. ..................... 365/185.33

Primary Examiner—David Nelms
Assistant Examiner—David Lam
Attorney, Agent, or Firm—William B. Kempler; Frederick J. Telecky, Jr.

[57] ABSTRACT

FLASH Memory hardware Block or sector Clear Operation using a single block or sector operation without using "byte-mode" processing is described. This hardware Block or sector Clear operation does not use avalanche injection, and has several distinct advantages, including programming simplicity, increased device reliability and yield. Use of the hardware block or sector clear operation described here results in increased programming speed, faster chip testing, and faster write/erase cycling compared to the normal operations of prior art.

5 Claims, 9 Drawing Sheets

| FUNCTION | SELECTED WORD LINE | DESELECTED WORD LINE | SELECTED BIT LINE | DESELECTED BIT LINE | BACK GATE (ISOLATED P-WELL) | SELECTED SOURCE LINE SELECTED SEGMENT LINE | VIRTUAL GROUND |
|---|---|---|---|---|---|---|---|
| Program (write '0') (byte-by-byte) | ~10-12 volts | ~0 volts | 6-7 volts | Float | ~0 volts | ~0 volts | ~0 volts |
| Sector or Block Erase (write '1') | ~0 volts | -15 volts | Float | Float | ~15 volts | Float | Float |
| Read (normal verification) | 5 volts | ~0 volts | 1.2 volts | Float | ~0 volts | ~0 volts | ~0 volts |
| Flash Write | ~12 volts | n/a | ~0 volts | n/a | ~0 volts | ~0 volts | ~0 volts |
| Sector or Block Clear | ~15 volts | n/a | Float | n/a | ~0 volts | ~0 volts | Float |

FLASH MEMORY BLOCK OR SECTOR CLEAR OPERATION

TECHNICAL FIELD OF THE INVENTION

The technical field of this invention is FLASH memory and more particularly block or sector clearing of FLASH memory.

BACKGROUND OF THE INVENTION

Semiconductor memories of several types have become key support hardware for today's computer systems. While DRAM (dynamic random access memory) has been used mainly in the form of dedicated chips, most of the other types have been employed both as dedicated chips and as embedded memory, located on the main central processing unit chip.

These other types include: (1) SRAM (static random access memory), (2) ROM (read-only memory), (3) EPROM (electrically programmable read-only memory), (4) EEPROM (eraseable electrically programmable read-only memory), and (5) FLASH (an acronym meaning simply "high speed eraseable, electrically programmable read-only memory"). The last three, EPROM, EEPROM, and FLASH use basically similar device technology process steps and device structure at the heart of the memory element. The key device is a dual-gate NMOS transistor. A first gate, called the control gate, is normally connected to the circuit node which electrically drives it. A second gate is floating electrically and is used to hold a charge. This charge can be altered electrically by applying a combination of specific values of impressed voltages on the normal gate and source/drain terminals. The charge present on the floating gate determines whether a logical "0" or a logical "1" is stored at the cell location of the floating gate transistor.

This floating gate structure is a compact device. The precision process from which it is formed provides a transistor well controlled in its characteristics. There are three basic differences of the FLASH structure over the EPROM structure. In the FLASH structure the geometric details around the periphery and within the active area of the gates have been modified to make the device more amenable to programming in-sitsu, that is programming while the device is located in its application socket. The gate oxide thickness has been reduced in the FLASH memory element transistor. This allows for charge tunnelling to occur and makes possible channel erasing. In channel erasing the central active area of the channel participates in the erasing rather than only at the active gate periphery. The FLASH device also includes additional required biasing circuitry to allow erasing.

In order of historical sequence, the PROM was first used for read-only memory applications and the devices were programmed by a masking operation. In order to satisfy the need for custom programming with short turn-around time at the user's location, the EPROM was developed next. Such EPROMs can be erased only by UV light, thus the and packages have to be transparent. This, by its nature, ruled out embedded processor usage, as the embedded processors can not be encased in such packages.

The EEPROM was developed next and it allowed electrical erasing without UV light. The EEPROM required an extra transistor for select in each cell and this made the chip area per cell too costly. The FLASH memory cell surmounts all the objections, giving excellent performance and excellent cell density. The conventional FLASH memory remains the solution of choice in read-only memory applications.

The FLASH memory also has seen needed incremental technology improvements, leading to better producibility, reliability, and performance. Ease of programming is also an area undergoing continued investigation and experimentation. Texas Instruments FLASH memory devices differ in two important respects from other FLASH memory devices being produced.

Figure 1:
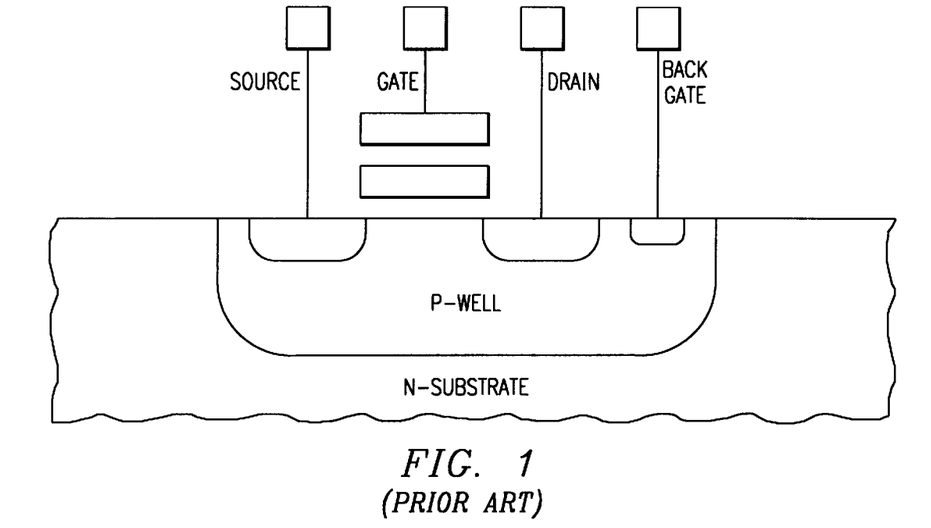
FIG. 1 illustrates the structure of a prior art N-epitaxial FLASH memory process structure.
Figure 2:
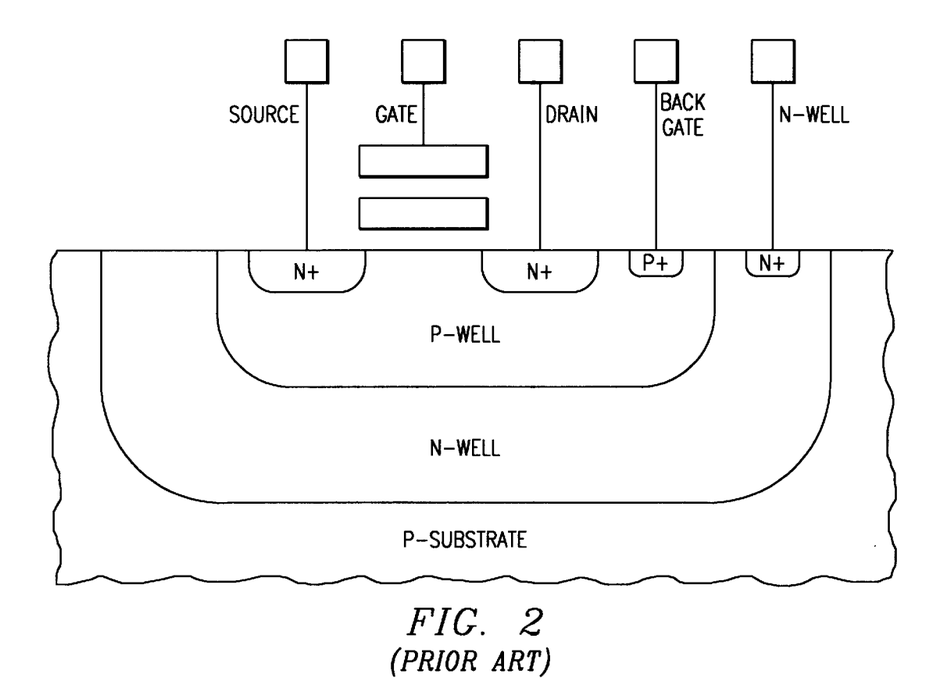
FIG. 2 illustrates the prior art structure of the Texas Instruments P-epitaxial substrate process in comparison to other FLASH memory process structures.
Figure 3:
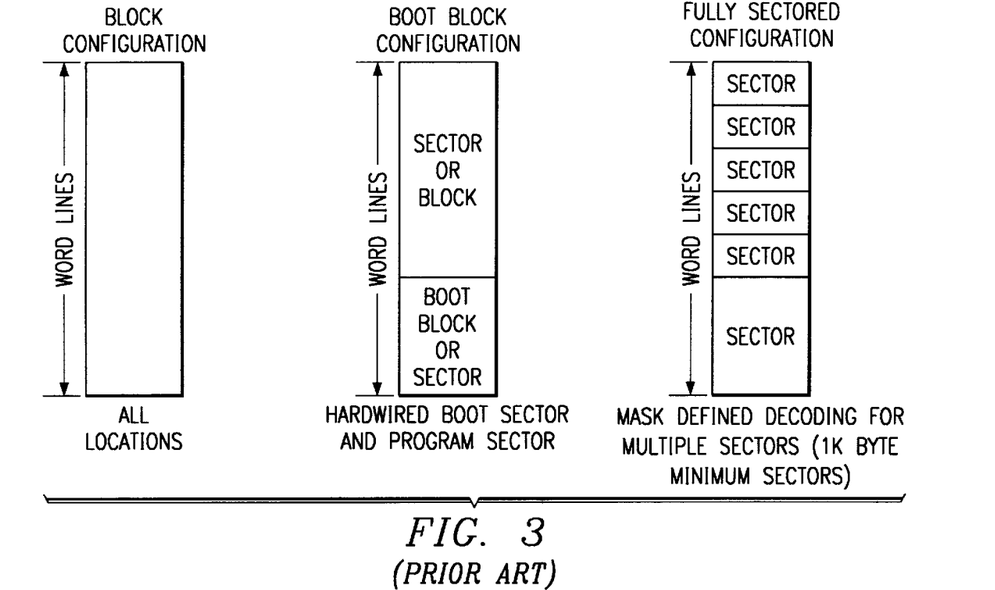
FIG. 3 illustrates the prior art concept of block, boot block and fully sectored FLASH memory configurations.

First, some prior art FLASH memories use N-epitaxial structures or even simple P-substrate structures, which do not allow for selective bias to the back-gate of a cell. FIG. 1 shows such an N-epitaxial structure. Selective bias cannot be applied to the N-epitaxial back-gate which is common to all devices. FIG. 2 shows the Texas Instruments prior art device structure, a P-substrate epitaxial structure having an N-well back gate. This back gate has several advantages leading to the possibility of generating isolated components for effective circuit use, but most notably, enables a simple "block or sector" pre-programming step which erases either blocks or sectors of the whole array at once. Blocks and sectors are illustrated in FIG. 3. FIG. 3 illustrates three common organizations for FLASH memories. In the block configuration all locations are erased at once in a block erase operation. In the boot-block configuration, addressing may be directed to the programming sector or the boot block sector. Most FLASH memory arrays can conceptually be divided into a boot block data, which stores the "boot-the-module" program data, and other program data, which stores data handling all other program operations. Users normally have no need to re-program the "boot block data", but have frequent need to re-program some portion of the "other program data" of the array, usually all of the "other program data". Therefore, this configuration is suited to sector erase. In the fully sectored configuration, the erasing is carried out individually in multiple sectors. Conventional FLASH memories are committed to more complex erasing on a byte-by-byte basis. Secondly, Texas Instruments arrays use a switched "source select" line, operating to apply a virtual ground only to those bits being programmed or READ.

Figure 4:
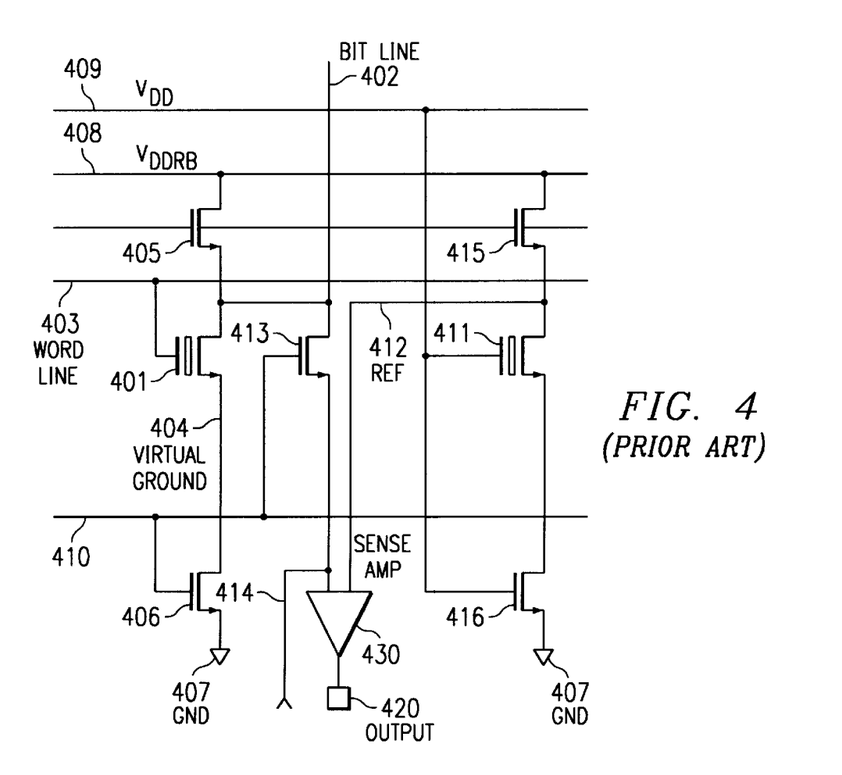
FIG. 4 illustrates a typical FLASH memory circuit configuration of the prior art.
Figure 5:
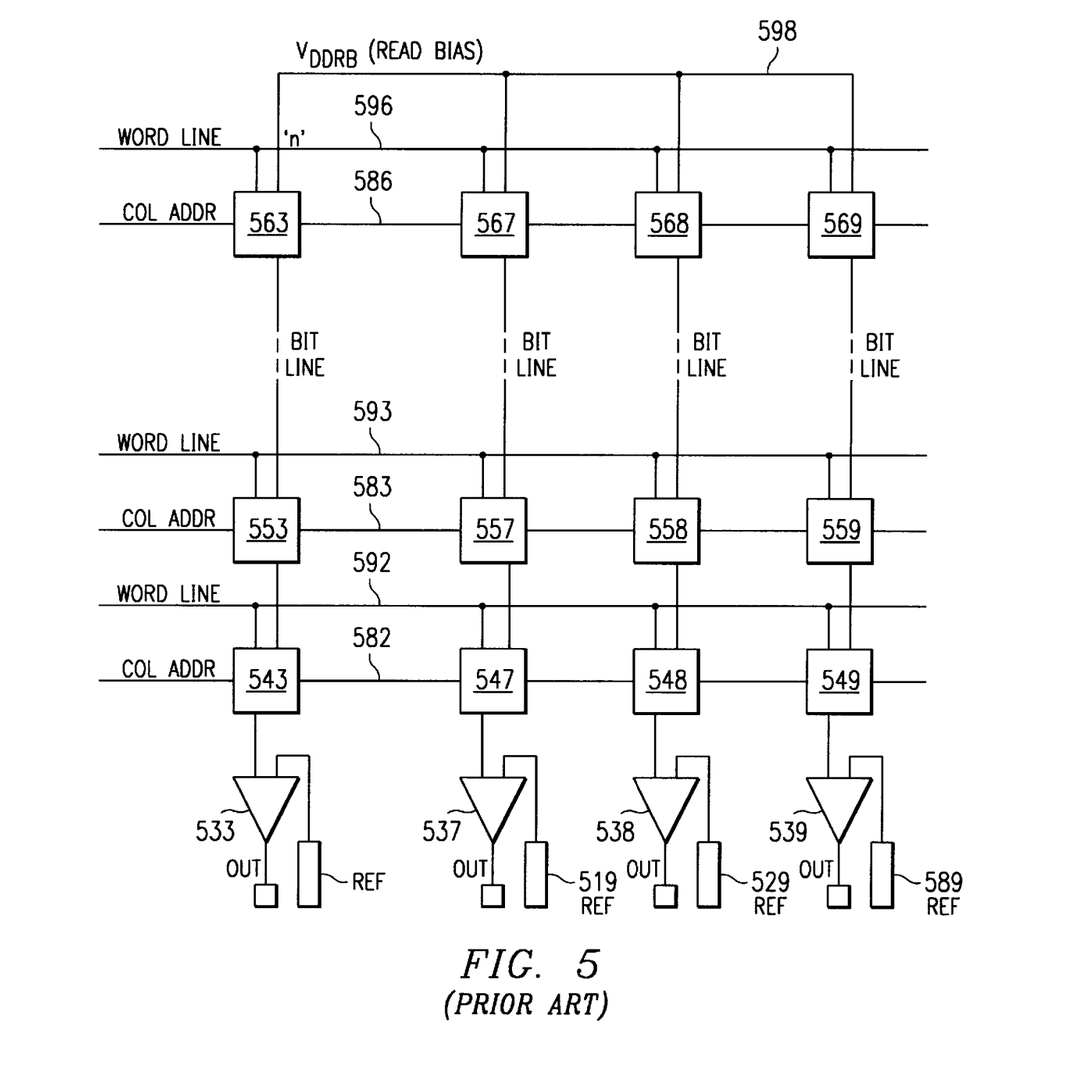
FIG. 5 illustrates the essentials of a prior art array of FLASH memory cells.

A typical prior art FLASH memory circuit configuration is shown in FIG. 4. The memory cell consists of (a) the floating gate N-Channel transistor 401 and (b) associated bit line 402 drive, word line 403, drive and virtual ground 404, and switch circuitry 406. FIG. 5 illustrates an array of such memory cells. These are normally arranged in groups of either 16 or 32 columns. These groups have a common sense amplifier such as 533, and either 8 or 16 sense amplifiers 533, 537, 538 and 539 form one eight-bit byte or one sixteen-bit word of output data.

Figure 6:
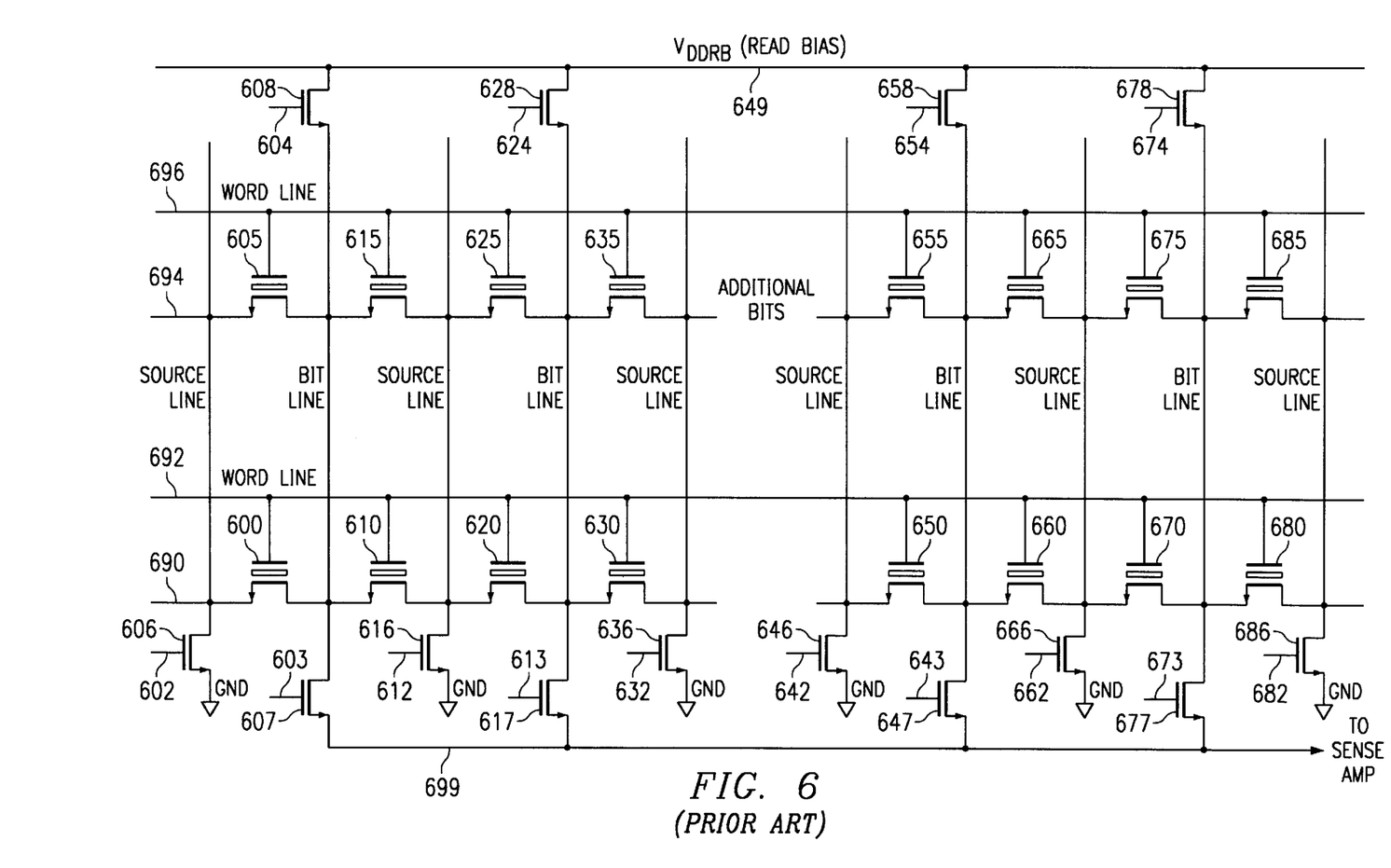
FIG. 6 illustrates the details of transistors and interconnection at the heart of the prior art memory cells.

During in programming or erasing sense amplifier 533 is used to verify that the correct logical state is stored at the desired location. In application usage for reading, sense amplifier 533 is used to detect the desired data and provide interface from the limited drive strength of the memory cell to a CMOS (or TTL) output buffer to the chip terminals or the embedded function's internal terminals. FIG. 6 shows eight bits in detail, four least significant bits (LSB) and four significant bits (MSB) of a sixteen or thirty-two bit column group. Two words are shown, word 0 and word N.

Figure 7:
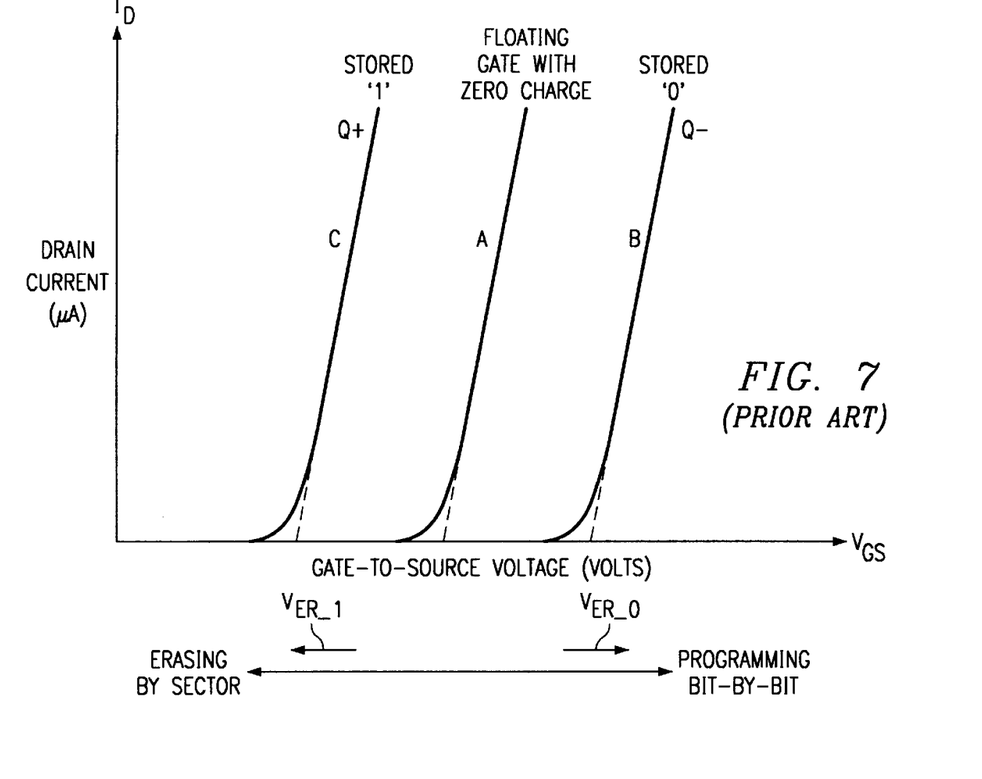
FIG. 7 describes the current-voltage (I-V) characteristics of a floating gate transistor of the prior art with the charge on floating gate as a parameter.

The floating gate N-Channel transistor (401 of FIG. 4) has the characteristics illustrated in FIG. 7. When this transistor has a zero charge on its floating gate, the transistor has the I-V (current-voltage) characteristic of curve "A". With a negative charge "$Q^-$" on the floating gate, the I-V characteristic shifts to curve "B". With a positive charge "$Q^+$" on the floating gate, the I-V characteristic shifts to curve "C".

Programming consists of addressing a particular word line 403 and a particular bit line 402. An appropriate voltage higher than the normal operational voltage is impressed on that word line. Simultaneously, the addressed bit line 402 is driven with the voltage required to charge the floating gate to value Q⁻ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Figure 8:
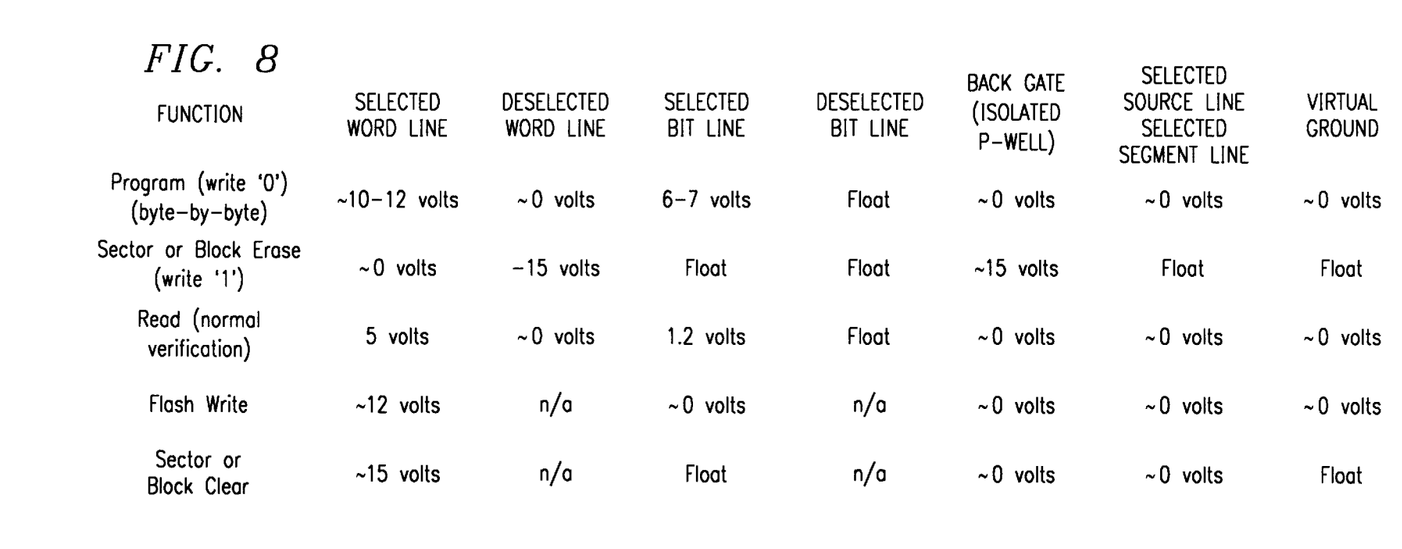
FIG. 8 gives a table of applied voltage conditions at the bit line, word line, and back-gate terminals and virtual ground state for program, erase and read according to the prior art and the conditions applied for testing for Bit Line Stress testing according to the prior art, FLASH write "1" according to the prior art and block or sector Clearing according to this invention.

Programming and erasing are normally carried out by applying pulses to the word line or the bit line requiring the higher voltage. The appropriate voltages are illustrated in the table of FIG. 8. By convention, the term "programming" is synonymous with writing "0" and "erasing" is synonymous with writing "1".

The "READ (normal verification)" operation shown in FIG. 8 verifies that programming has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of $10^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

SUMMARY OF THE INVENTION

This invention relates to a unique method of implementing a hardware "block or sector clear" operation on a FLASH memory using a single block or sector operation. This can be done using very little additional logic and without requiring any added complexity to the individual memory cells or any other portion of the array. This hardware approach makes additional use of circuit components already present on typical FLASH memory chips and adds only an additional "block or sector clear" operation to the other device functional operations of program, erase, and read. Further this hardware "block or sector clear" capability eliminates the need for the multi-word test operations which are not available to the user but are used only by the vendor to test and prepare the device for its user application.

This invention also allows faster chip testing, by allowing the needed "clear" to be accomplished in several milliseconds rather than in one second or more using the techniques of prior art. Because the memory must be programmed to an all logical "0" condition prior to "erase" operations, the user benefits by having a much shorter "erase" time and with better compaction of the overall programming operations. Finally the invention allows write/erase cycling to be accelerated compared to normal operation.

BRIEF DESCRIPTION OF THE DRAWINGS

These and other aspects of this invention are illustrated in the drawings, in which.

DETAILED DESCRIPTION OF PREFERRED EMBODIMENTS

Referring to the circuit configuration of FIG. 4, transistor 401 is the dual gate N-Channel device which is the memory element for a single bit. The bit line for writing data is line 402 and the word select line is line 403. The virtual ground node 404 is switched "on" for write "0" and for read operations and is allowed to float for write "1" and READ operations.

FIG. 5 shows a typical array of FLASH memory cells. Sense amplifier 533 is one of typically eight (or sixteen) such sense amplifiers in the array. The blocks 543, 553, 563; 547, 557, 567; 548, 558, 568; and 549, 559, 569 each contain column decoders and sixteen or thirty-two columns of memory elements such as illustrated in FIG. 4.

FIG. 6 shows eight bits in detail, four least significant bits (LSB) and four most significant bits (MSB) of the sixteen or thirty-two bit column group. Two words are shown, word 0 and word N. Transistors 607, 617, 647, and 677 are output transistors driven by the column decoders which electrically connect one of sixteen (or thirty-two) bit lines to the signal input to a corresponding sense amplifier. Source select transistors 606, 616, 636, 646, 666, 686 are driven from column decoders also, and select the "left side bit" (stored in transistor 600, for example) or the "right-side bit" (stored in transistor 610).

Eight (or sixteen) sense amplifiers illustrated by 533, 537, 538, 539 of FIG. 5 collectively form an eight-bit byte (or a sixteen-bit word) portion of the long memory word stored in the FLASH memory. As an example, with thirty-two column groups multiplexed into each sense amplifier, and an array having sixteen sense amplifiers, the word length is 512 bits.

The floating gate N-Channel transistor (401 of FIG. 4) has the characteristics illustrated in FIG. 7. When this transistor has a zero charge on its floating gate, the transistor has the I-V (current-voltage) characteristic of curve "A". With a negative charge "Q$^-$" on the floating gate, the I-V characteristic shifts to curve "B". With a positive charge "Q$^+$" on the floating gate, the I-V characteristic shifts to curve "C".

Programming consists of addressing a particular word line and a particular bit line. An appropriate voltage higher than the normal operational voltage is impressed on that word line. Simultaneously, the addressed bit line is driven with the voltage required to charge the floating gate to value Q$^-$ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Programming and erasing are normally carried out by applying pulses to the word line or the bit line requiring the higher voltage. The appropriate voltages are illustrated in the table of FIG. 8. By convention, the term "programming" is synonymous with writing "0" and "erasing" is synonymous with writing "1".

The "READ (normal verification)" operation shown in FIG. 8 verifies that programming has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of $10^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

Figure 9:
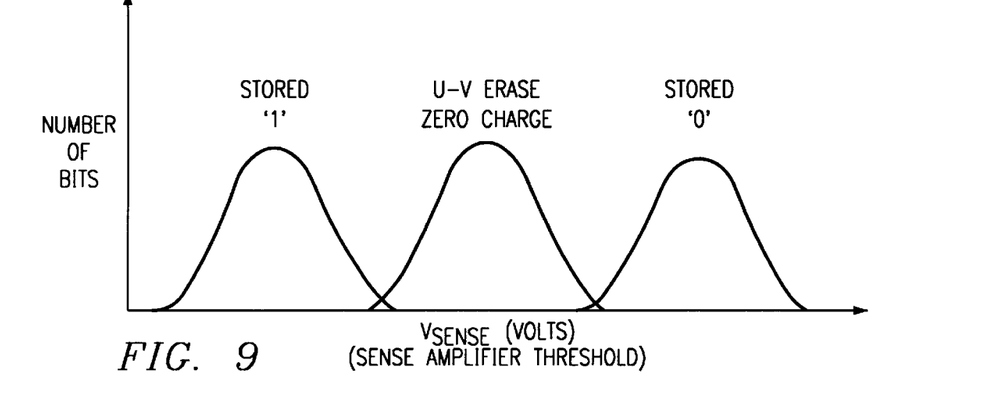
FIG. 9 illustrates an ideal case of the VSENSE transition voltage distribution for an array of cells of a typical FLASH memory, some cells holding a stored logical "0", and some cells holding a stored logical "1"
Figure 10:
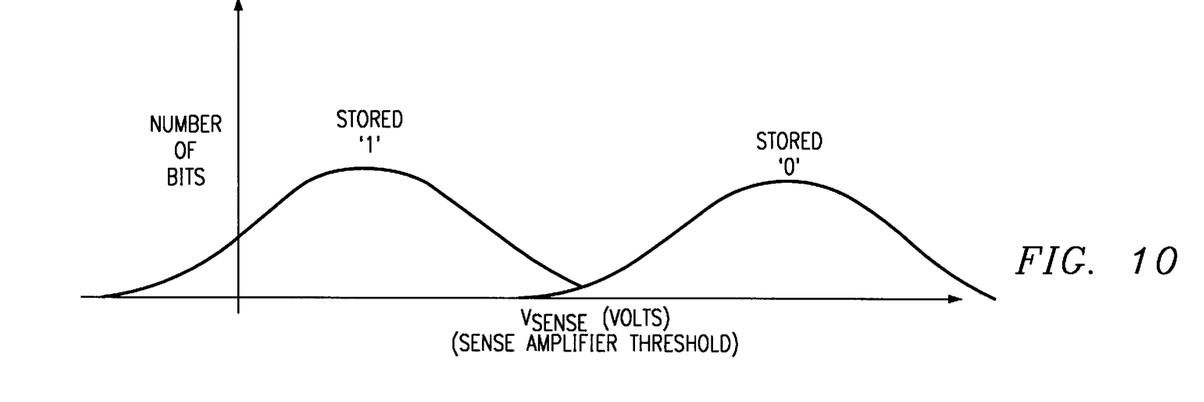
FIG. 10 illustrates a possible non-ideal, actual case of the $V_{SENSE}$ transition voltage distribution for an array of cells of a typical FLASH memory, some cells holding a stored logical "0", and some cells holding a stored logical "1", with some portion of the logical "1" distribution having a $V_{SENSE}$ value of less than zero volts.

FIG. 9 illustrates the ideal case statistical distributions of $V_{SENSE}$, which is the sense amplifier input trip voltage for the 1-0 or 0-1 transitions, plotted against the number of cells of the array at three conditions. These three conditions are logical "0", logical "1", and the zero charge condition. Ideally there is no overlap between these distributions and thus no confusion as to the state of a particular bit. FIG. 10 illustrates an example of an actual distribution of $V_{SENSE}$. Actual distributions on real devices are more likely to have a "flattened" character and also often have anomalous "bumps" on the tails of the distribution. In some cases the logical "1" distribution curve may even have a portion of its bits at the negative voltage level. This is a troubling programming problem and it can only be addressed in prior art by resort to complex additional programming sequences. The usual methodology involves a byte-by-byte programming of all bits in the array to a logical "0" first, followed by a standard verification of this operation using normal read verify "0" techniques. This time consuming process, which takes more than one millisecond, creates a bit distribution such as given in FIG. 11 in which the logical "0" curve is truncated because of the verify "0" test condition applied to the sense amplifier reference terminal. Pulsing is applied according to the write "0" prescription of FIG. 8 until the truncated distribution is obtained. This procedure ensures that the device has no bits below the reference value trip point.

Figure 11:
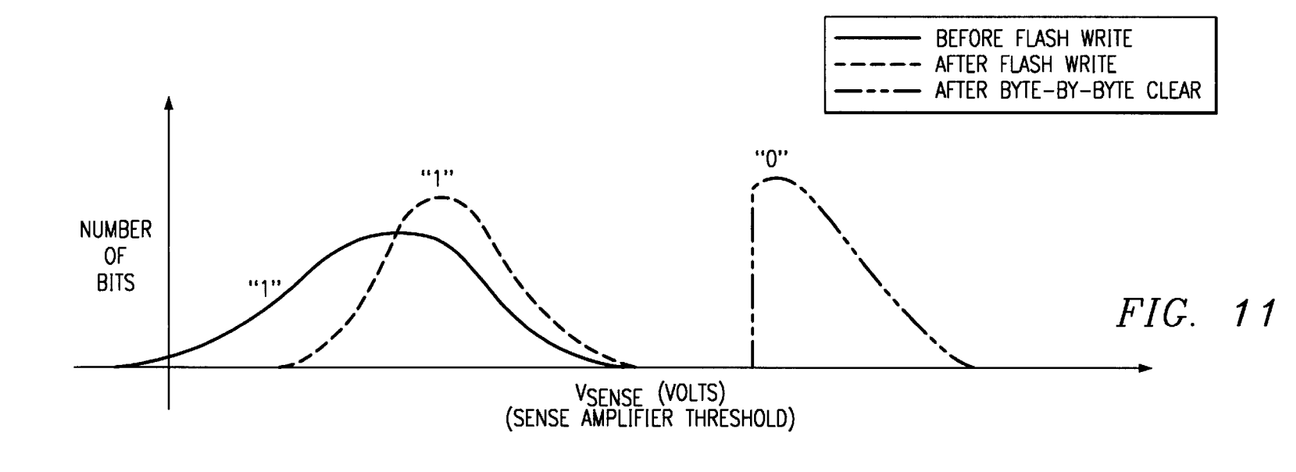
FIG. 11 illustrates the $V_{SENSE}$ distributions for an array of cells which have been "cleared" by writing all logical "0" states to each bit of the array (byte-by-byte programming) and verifying the stored logical "0" using the prior art verify(0) operation, and the FLASH write "1" distribution which is performed after the above clear operation according to the prior art.
Figure 12:
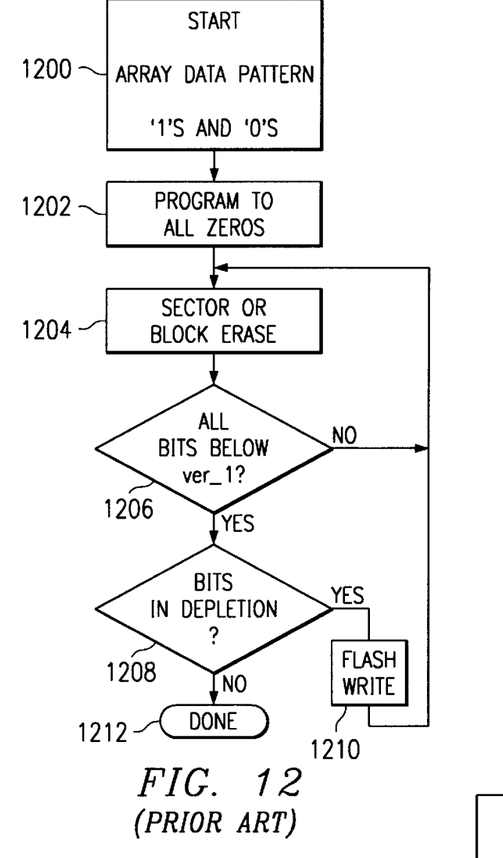
FIG. 12 illustrates a Flow Diagram for a typical pre-programming clear/erase sequence using the time-consuming, cumbersome "program-to-all-zeros" step of the prior art for a FLASH memory device prior to customizing the bit-by-bit stored information using the normal program/erase operations.

FIG. 12 illustrates in flow diagram form a conventional pre-programming erase sequence for a FLASH memory device prior to customizing the bit-by-bit stored information using the normal program operation. The most difficult step by far, in both complexity and the amount of time required, is step 1202 of FIG. 12. This is the problem addressed by this invention. The pre-programming operations of FIG. 12 are as follows. The process begins with an array data pattern of "1's" and "0's" (start block 1200). The process first, restores all bits of the array to a logical "0" condition (processing block 1202). This programming step requires byte-by-byte setting of the memory bits to "0". Then the process erases sectors or blocks to a logical "1" condition (processing block 1204). Next the process examines these stored logical "1's" to verify that all are below sense amplifier threshold ver_1 (decision block 1206). If some bits were found below ver_1, then the process re-initializes the Block or sector Erase (processing block 1204). The process next examines these stored logical "1's" to verify that none are in depletion, that is below zero volts, (decision block 1208). If some bits were found to be in depletion, then the process performs a Flash Write (processing block 1210) and then repeats the Block or sector Erase (processing block 1204). If none of the bits were found in depletion, then the process is complete and is exited via exit block 1212. These pre-programming steps cause the distributions to develop as illustrated in FIG. 11. Replacing the time-consuming, cumbersome programming to all "0's" of step 1202 of FIG. 12 is the heart of this invention.

Figure 13:
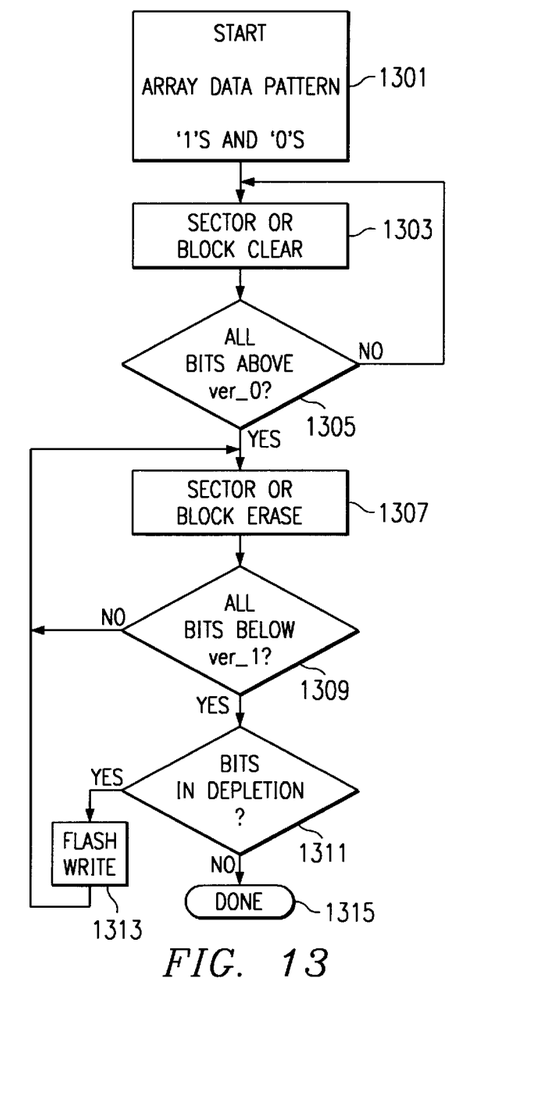
FIG. 13 illustrates a flow diagram for the pre-programming clear/erase sequence using the block or sector clear operation of this invention for a FLASH memory device prior to customizing the bit-by-bit stored information using the normal Program/Erase operations.

The device conditions required to implement the block or sector clear hardware operation of this invention (clearing of all bits simultaneously) are illustrated in FIG. 8. The pre-programming steps for a FLASH memory device having the block or sector clear feature of this invention are illustrated in FIG. 13. These steps are as follows. The process begins with an array data pattern of "1's" and "0's" (start block 1301). Then the process clears sectors or blocks to a logical "0" condition (processing block 1303) using the block or sector clear operation of this invention. Next the process verifies whether all bits are above the logical "0" threshold ver_0 (decision block 1305). If all the bits were not above the logical "0" threshold ver_0, then the sector or block clear operation is repeated (processing block 1303). If all the bits were above the logical "0" threshold ver_0, then the process then performs a block or sector erase to the logical "1" condition (processing block 1307). The process next examines these stored logical "1's" to verify that all are below the logical "1" threshold ver_1 (decision block 1309). If some bits were found below the logical "1" threshold ver_1, then the process re-initiates the block or sector erase (processing block 1307). If all the bits were below the logical "1" threshold ver_1, then the process examines these stored logical '1' to verify that none are in depletion, that is below zero volts (decision block 1311). If some bits were found to be in depletion, then the process performs a Flash Write (processing block 1313), followed by a repeat of the block or sector erase (processing block 1307). If none of these bits were found to be in depletion, the process is complete and is exited (exit block 1315).

Figure 14:
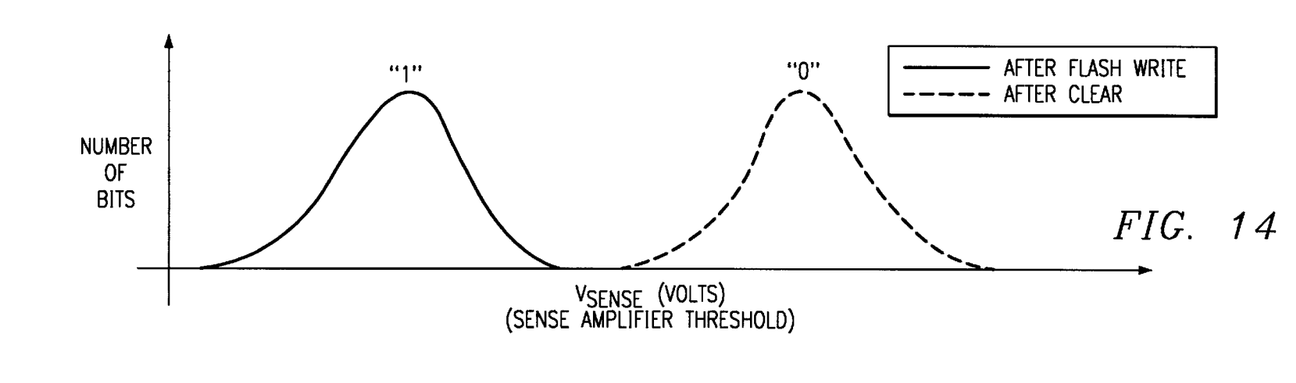
FIG. 14 illustrates the VSENSE distribution for an array of cells which have been "cleared" by writing all logical "0" states to every bit of the array simultaneously with the block or sector clear operation of this invention and verifying the stored logical "0" using the standard verify(0) operation and the $V_{SENSE}$ distribution for an array of cells which have been cleared by writing all "1" following the above Block or sector Clear operation of this invention.

In the block or sector clear operation of this invention, all words are simultaneously subjected to 15 volt pulses at the word line and all bit lines are held at zero volts (see FIG. 8). The block or sector clear operation uses quantum mechanical tunneling and generates a charge $Q^-$ on all floating gates to as noted in FIG. 7. This block or sector clear operation provides a tolerance. FIG. 14 illustrates the $V_{SENSE}$ distributions of logical "1's" resulting from the block or sector clear operation of this invention and the distributions of logical "0's" following the subsequent FLASH write "1", program, erase, and verify operations. Advantages of this invention are as follows. The negative voltage portion of the $V_{SENSE}$ distribution of logical "1's" is avoided by using the block or sector clear operation as the first step of the pre-programming procedure. This block or sector clear operation is done before custom bit-by-bit programming (write "0") operation. This leads to simpler and more straightforward custom programming. The beneficial block or sector clear operation of the whole FLASH memory is accomplished in milliseconds because all bits in a block or sector are cleared simultaneously. The prior art employs lengthy byte-by-byte programming to a logical "0". This prior art technique could require seconds of time to clear the entire FLASH memory. The hardware required for the hardware block or sector clear operation of this invention is almost completely available on typical FLASH memory chips not supporting a hardware block or sector clear operation. Only slight modifications to one of the two FLASH memory charge pumps are required. This modification (detailed below in conjunction with FIG. 15) consists of additional taps on the reference to the charge pump voltage comparator to generate the block or sector clear (+15 volts) pulses which are routed to the word line. Finally, a only minor amount of steering logic and additional control register bits and associated logic are required to implement the block or sector clear operation.

Figure 15:
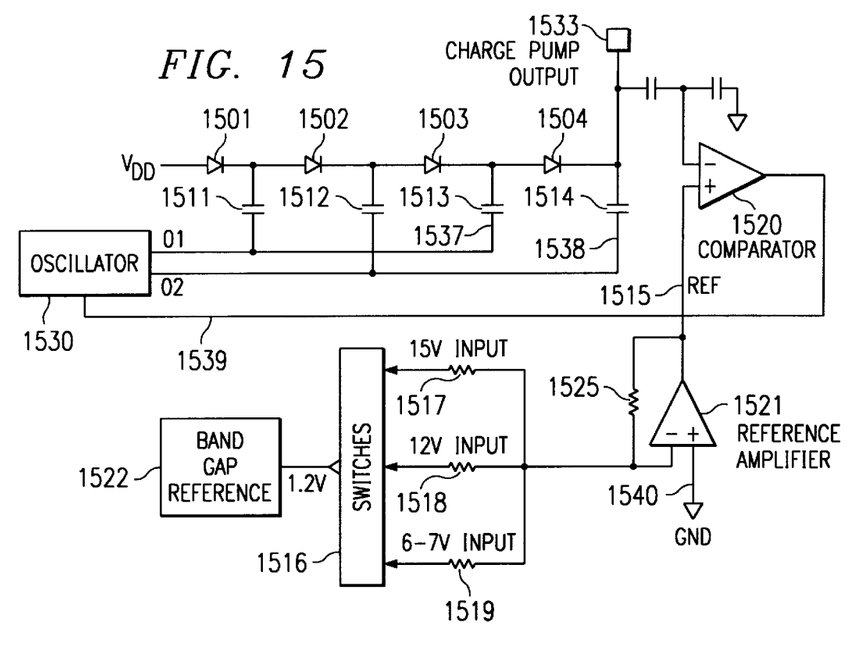
FIG. 15 illustrates the "charge pump" circuit which is a part of typical FLASH memory devices and which includes minor additional reference input taps used at the sense amplifier input circuitry to generate the additional signal amplitudes required by the pulses used in the Block or sector Clear operation in accordance with this invention.

The typical charge pump circuit found on FLASH memories as modified to support block or sector clear operation is illustrated in FIG. 15. Circuit elements 1501, 1502, 1503 and 1504 are illustrated as diodes but may be implemented as diode-connected MOS transistors. A two-phase clock oscillator 1530 drives a bootstrap circuit function which generates a monotonic charge build-up on capacitors 1511, 1512, 1513 and 1514. The comparator 1520 and the feedback loop to clock oscillator 1530 act to generate a pre-determined pulse amplitude which is defined by the reference signal applied at the reference input to comparator 1520.

The reference voltage 1515 for comparator 1530 is derived from a band gap reference circuit, commonly used in such applications. This circuit produces a nominal 1.2 volt output, stable under temperature and supply voltage variations. The reference voltage is scaled up to the desired value at the comparator input through the reference amplifier 1521 and resistors 1517, 1518, 1519 and 1525. Two voltages are needed in some of the operations of FIG. 8. As illustrated in FIG. 8, the normal operations of program, read and FLASH write require only two voltages, a high voltage of about 12 volts at low current, and a lower voltage of from 6 to 7 volts at somewhat higher current. These voltages are supplied by way of electronic switching through 1516 and resistors 1518 and 1519. A third voltage of ±15 volts is required for the block or sector erase operation and the block or sector clear operation. This voltage is supplied by way of electronic switching through 1516 and resistor 1517. As can be seen in FIG. 15, the charge pump circuit is require to produce two voltages even without the block or sector clear operation. Therefore, minimal new hardware is necessary to implemented this invention.

Figure 16:
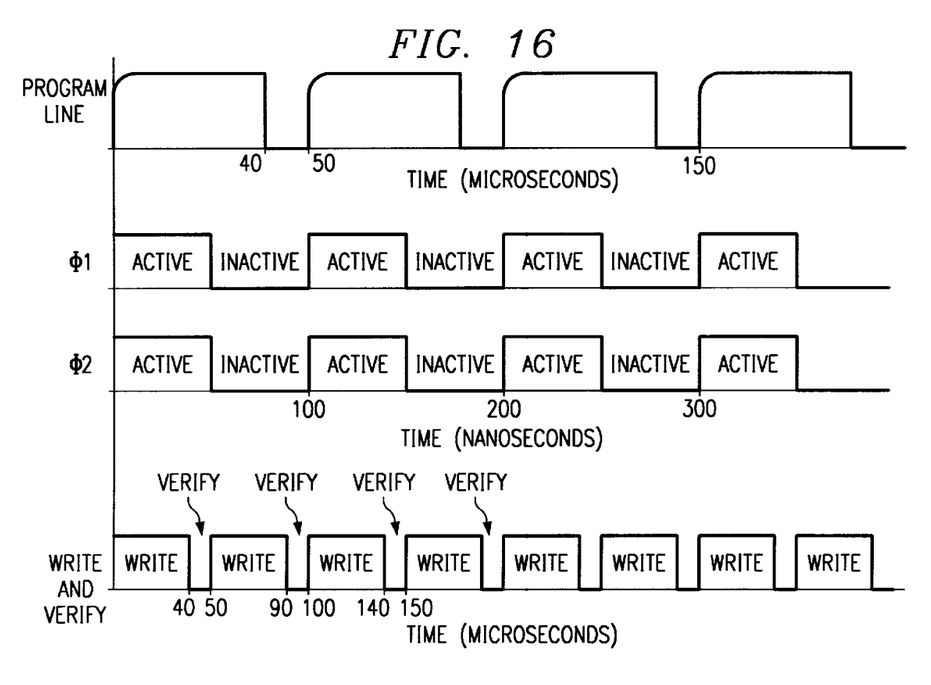
FIG. 16 illustrates the waveforms and pulse techniques by which the "high voltage" pulses applied to word lines, bit lines and back-gate in all the non-read operations (write/clear and erase) are generated.

FIG. 16 depicts the pulsed nature of the programming operations. According to the prescription of FIG. 8, pulses of a several microsecond duration are applied to the device terminal requiring the high voltage condition. These pulses are actually the envelope of a burst of pulses occurring at the frequency of the two phase clocks. These pulses are turned off at alternate time intervals to accommodate the verify operation. As noted earlier, the pulses are re-applied on subsequent passes until the desired programming result has been verified to be successful.

Although the preferred embodiment has been described in detail, it should be understood that various changes, substitutions and alterations can be made therein without departing from the spirit and scope of the invention as defined by the appended claims.

What is claimed is:

1. A method of operating FLASH memory comprising the steps of:
   disposing an array of memory cells in rows and columns and in at least one sector, each of said memory cells consisting of a dual gate N-Channel transistor having a floating gate for storing an electronic charge said charge having one of multiple value distributions, each value distribution determining a stored binary logic state, each sector consisting of a set of said array of memory cells disposed in an isolated N-type semiconductor well within a P-type substrate;
   connecting a first source-drain terminal of each dual gate N-Channel transistor to virtual ground;
   connecting a second source-drain terminal of each dual gate N-Channel transistor within each column of said array to a corresponding bit line;
   connecting a control gate of each dual gate N-Channel transistor within each row to a corresponding word line; and
   simultaneously applying a high voltage to each word line of a selected sector of said memory cells and applying a ground voltage to a back gate of said isolated N-type semiconductor well corresponding to said selected sector, thereby simultaneously clearing data stored in each memory cell of said selected sector.

2. The method of operating FLASH memory of claim 1, further comprising the steps of:
   reading each memory cell of said selected sector to determine if said value distribution stored on said floating gate of each corresponding dual gate N-Channel transistor indicates a stored binary logic state of "0"; and
   repeating said step of simultaneously applying a high voltage to each word line of a selected sector of said memory cells and applying a ground voltage to a back gate of said isolated N-type semiconductor well corresponding to said selected sector if said value distribution stored on said floating gate of any corresponding dual gate N-Channel transistor fails to indicate a stored binary logic state of "0".

3. The method of operating FLASH memory of claim 1, wherein:
   said step of disposing an array of memory cells in rows and columns and in at least one sector consists of disposing said array of memory cells in a single sector; and
   said step of simultaneously applying a high voltage to each word line of a selected sector of said memory cells and applying a ground voltage to a back gate of said isolated N-type semiconductor well corresponding to said selected sector consists of simultaneously applying said high voltage to each word line of said memory cells and applying said ground voltage to said back gate of said isolated N-type semiconductor well corresponding to said single sector.

4. The method of operating FLASH memory of claim 1, wherein:
   said step of disposing an array of memory cells in rows and columns and in at least one sector consists of disposing said array of memory cells in a boot sector for storing data unlikely to be changed often and a second sector for storing data subject to change; and
   said step of simultaneously applying a high voltage to each word line of said selected sector of said memory cells and applying a ground voltage to a back gate of said isolated N-type semiconductor well corresponding to said second sector consists of simultaneously applying said high voltage to each word line of said memory cells and applying said ground voltage to said back gate of said isolated N-type semiconductor well corresponding to said second sector.

5. The method of operating FLASH memory of claim 1, wherein:
   said step of disposing an array of memory cells in rows and columns and in at least one sector consists of disposing said array of memory cells in a plurality of sectors; and
   said step of simultaneously applying a high voltage to each word line of a selected sector of said memory cells and applying a ground voltage to a back gate of said isolated N-type semiconductor well corresponding to said selected sector consists of sequentially simultaneously applying said high voltage to each word line of said memory cells and applying said ground voltage to said back gate of said isolated N-type semiconductor well corresponding to each of said plurality of sectors in a predetermined order.

* * * * *